United States Patent
Stanek

(10) Patent No.: US 6,698,638 B2
(45) Date of Patent: Mar. 2, 2004

(54) PRINTED CIRCUIT BOARD SCRAP EDGE REMOVAL TOOL

(75) Inventor: Gary E. Stanek, Stillman Valley, IL (US)

(73) Assignee: AG Communication Systems Corporation, Phoenix, AZ (US)

( * ) Notice: Subject to any disclaimer, the term of this patent is extended or adjusted under 35 U.S.C. 154(b) by 0 days.

(21) Appl. No.: 10/150,815

(22) Filed: May 20, 2002

(65) Prior Publication Data

US 2003/0214771 A1 Nov. 20, 2003

(51) Int. Cl.[7] .................................................... B26F 3/00
(52) U.S. Cl. ......................................... 225/96.5; 225/93
(58) Field of Search ........................... 225/93, 96, 96.5, 225/97, 103, 104, 105, 2; 29/413, 403.1, 403.2, 403.3, 412; 269/40, 296, 305, 903, 152, 153, 154, 155; 81/426.5

(56) References Cited

U.S. PATENT DOCUMENTS

| | | | | | |
|---|---|---|---|---|---|
| 2,869,433 | A | * | 1/1959 | Dery | 269/154 |
| 3,584,863 | A | * | 6/1971 | Ryswick | 269/245 |
| 4,717,058 | A | * | 1/1988 | Gobert | 225/93 |
| 6,276,676 | B1 | * | 8/2001 | Martinez et al. | 269/305 |

* cited by examiner

*Primary Examiner*—Stephen Choi
(74) *Attorney, Agent, or Firm*—David J. Zwick; Steven R. Santema

(57) ABSTRACT

A PCB scrap edge removal tool comprising scrap removal jaws formed of two matching opposing pieces of metal having cut-outs in a castellated fashion. The jaws have a gap between them for receiving a PCB work piece to be finished. Metal dowels for PCB positioning span the gap. A PCB is positioned in the gap and rocked back and forth to break off the scrap edge pieces. The cut-outs in the scrap removal jaws correspond to portions of the PCB edge that are not to be removed. These portions move freely in the cut-outs as the PCB is rocked back and forth.

3 Claims, 5 Drawing Sheets

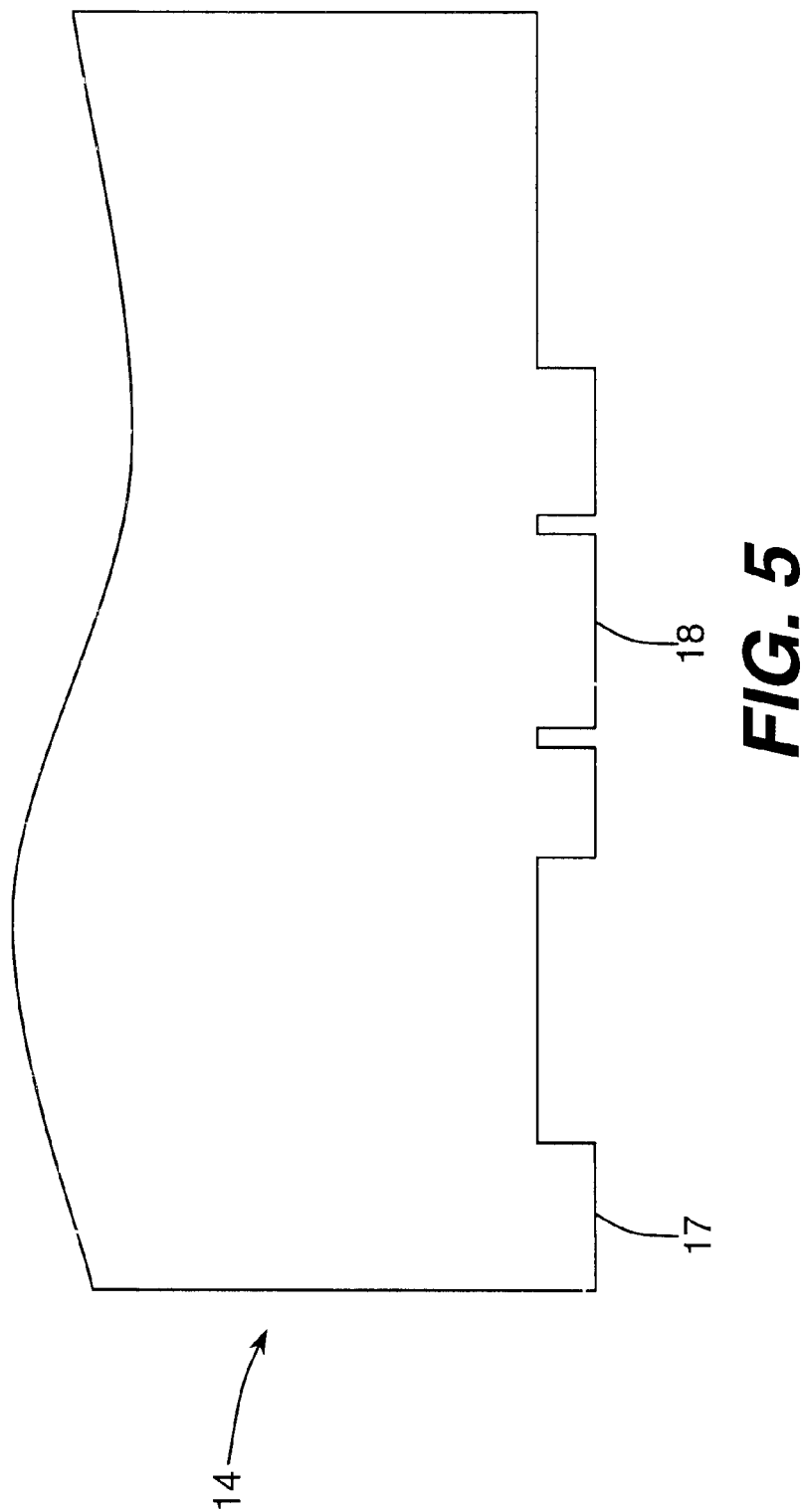

PRINTED CIRCUIT BOARD SCRAP EDGE REMOVAL TOOL

FIELD OF THE INVENTION

The present invention relates to printed circuit board manufacturing, and more particularly to removing scrap material at the edges of the printed circuit board remaining after the automated manufacturing process.

BACKGROUND OF THE INVENTION

Printed circuit boards (PCBS) are typically manufactured using automated equipment. To accommodate the manufacturing process and to allow for PCBs of various shapes and sizes, PCBs are manufactured on panels of PCB substrates having a uniform size. The panels are sized larger than the PCBs to allow for a handling edge of scrap material surrounding the PCB that is removed in a last finishing step of the manufacturing process.

To aid in the manual removal of the scrap edges, the substrate panel may be scored at the boundary of the PCB on the substrate, the panel may be routed at the boundary of the PCB on the substrate, leaving break-away tabs allowing for removal of scrap edge pieces, or a combination of both techniques may be used.

Manual removal of the scrap edges is typically accomplished by grasping the panel, and grabbing the scrap material by hand or pliers and breaking it off of the panel. A problem with both these methods is that they don't always provide a clean break where intended and components on the PCBs may be damaged.

SUMMARY OF THE INVENTION

Accordingly, it is an object of the present invention to provide a tool to cleanly remove scrap edges while minimizing potential damage to PCB components.

The present invention is a PCB scrap edge removal tool comprising scrap removal jaws formed of two matching opposing pieces of metal having cut-outs in a crenellated fashion. The opposing scrap removal jaws have a gap between them for receiving a PCB work piece to be finished. Metal dowels for PCB positioning span the gap. A PCB is positioned in the gap and rocked back and forth to break off the scrap edge pieces. The cut-outs in the scrap removal jaws correspond to portions of the PCB edge that are not to be removed. These PCB portions move freely in the cut-outs as the PCB is rocked back and forth.

DESCRIPTION OF THE DRAWINGS

FIG. 5 shows a portion of a PCB work piece with scrap edges removed for a preferred embodiment of the present invention.

DESCRIPTION OF THE PREFERRED EMBODIMENT

Figure 1:
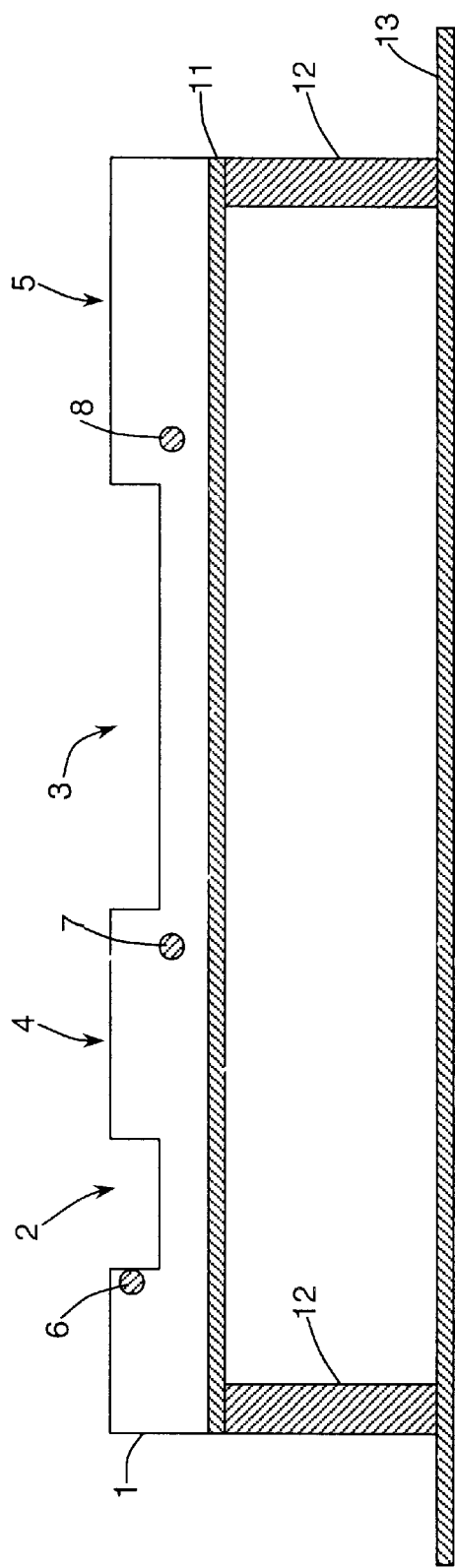
FIG. 1 shows a side view of a preferred embodiment of the present invention.
Figure 2:
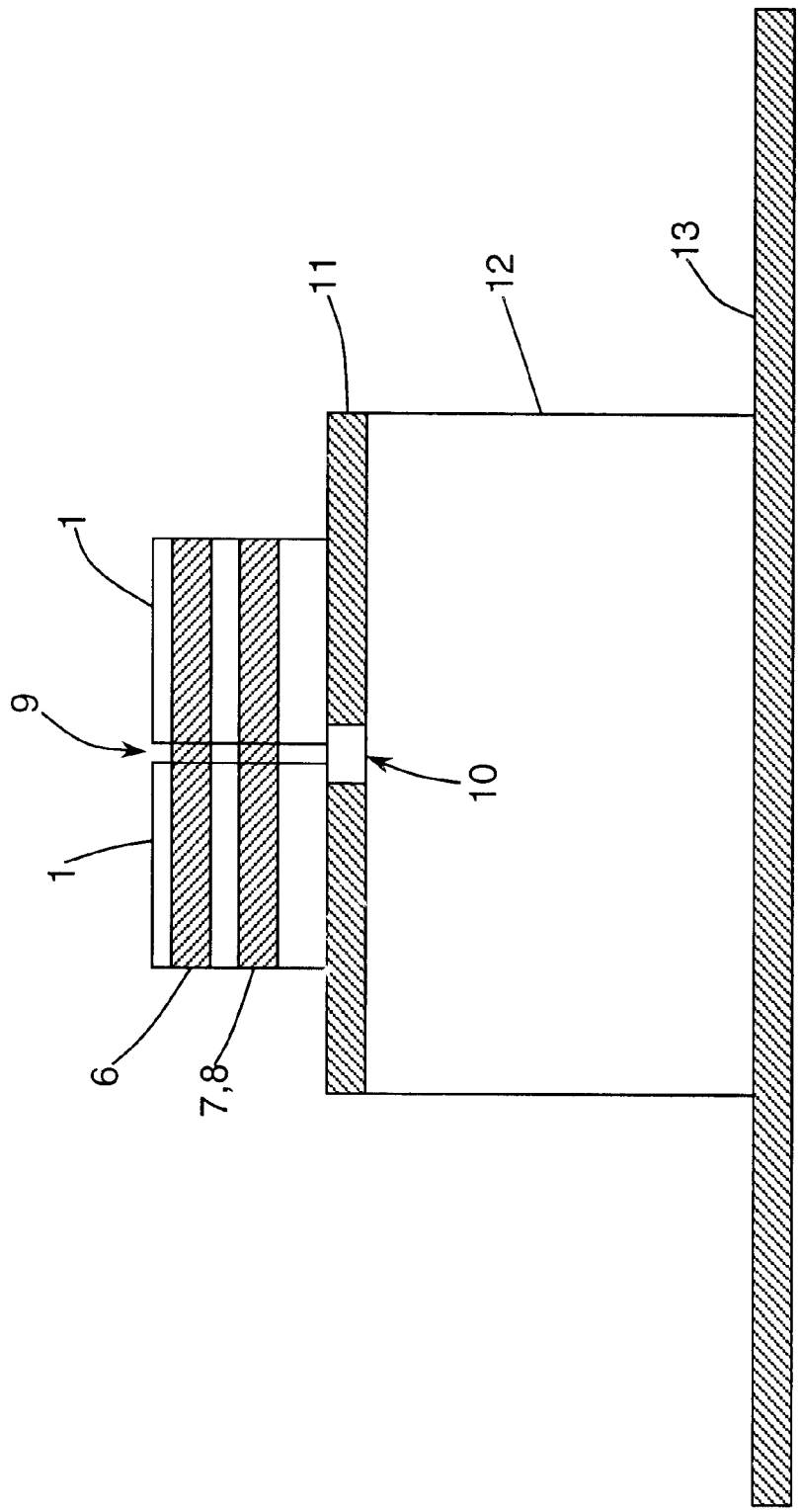
FIG. 2 shows an end view of a preferred embodiment of the present invention.
Figure 3:
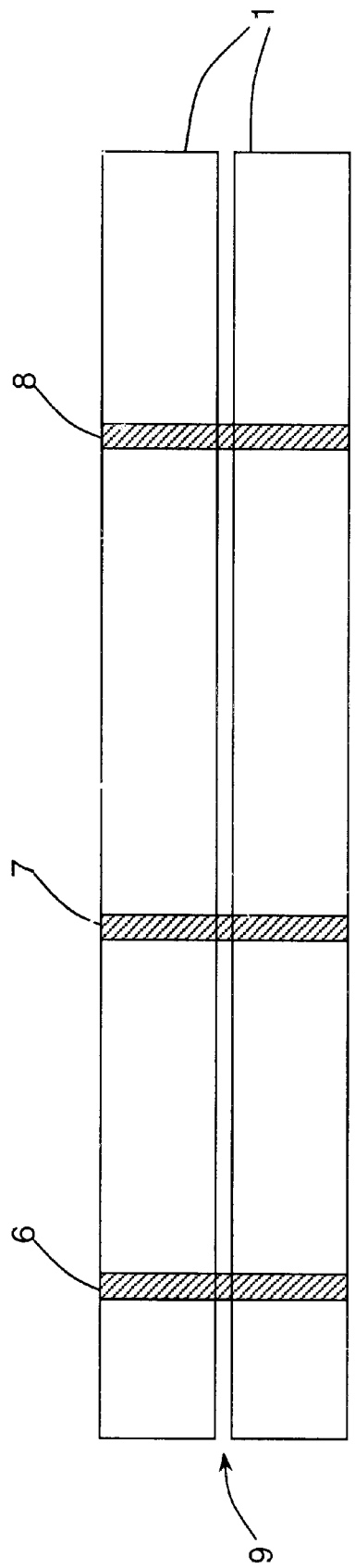
FIG. 3 shows a top plan view of the scrap edge removal jaws of a preferred embodiment of the present invention.

FIG. 1 shows a side view of a preferred embodiment of the present invention, FIG. 2 shows an end view of a preferred embodiment of the present invention and FIG. 3 shows a top view of the scrap edge removal jaws of the preferred embodiment of the present invention. In the preferred embodiment, the present invention comprises a pair of matching opposing scrap removal jaws 1 having advantageously placed crenatures, or cut-outs 2 and 3 and adjacent scrap removal jaw portions 4 and 5 (crenations) on the upper faces. Scrap removal jaws 1 are held in a spaced apart relationship, thus forming a uniform gap 9 between the jaws 1. Gap 9 is wide enough that a PCB panel can easily be inserted and removed edgewise. Metal dowels 6, 7 and 8 serve to position a PCB work piece in gap 9, and may also serve to hold jaws 1 in the spaced apart relationship.

Scrap removal jaws 1 are attached to slotted plate 11 having a slot 10 collinear with gap 9. The dimensions of slot 10 are further discussed below. Slotted plate 11 is attached to side uprights 12, which are in turn attached to base plate 13.

Figure 4:
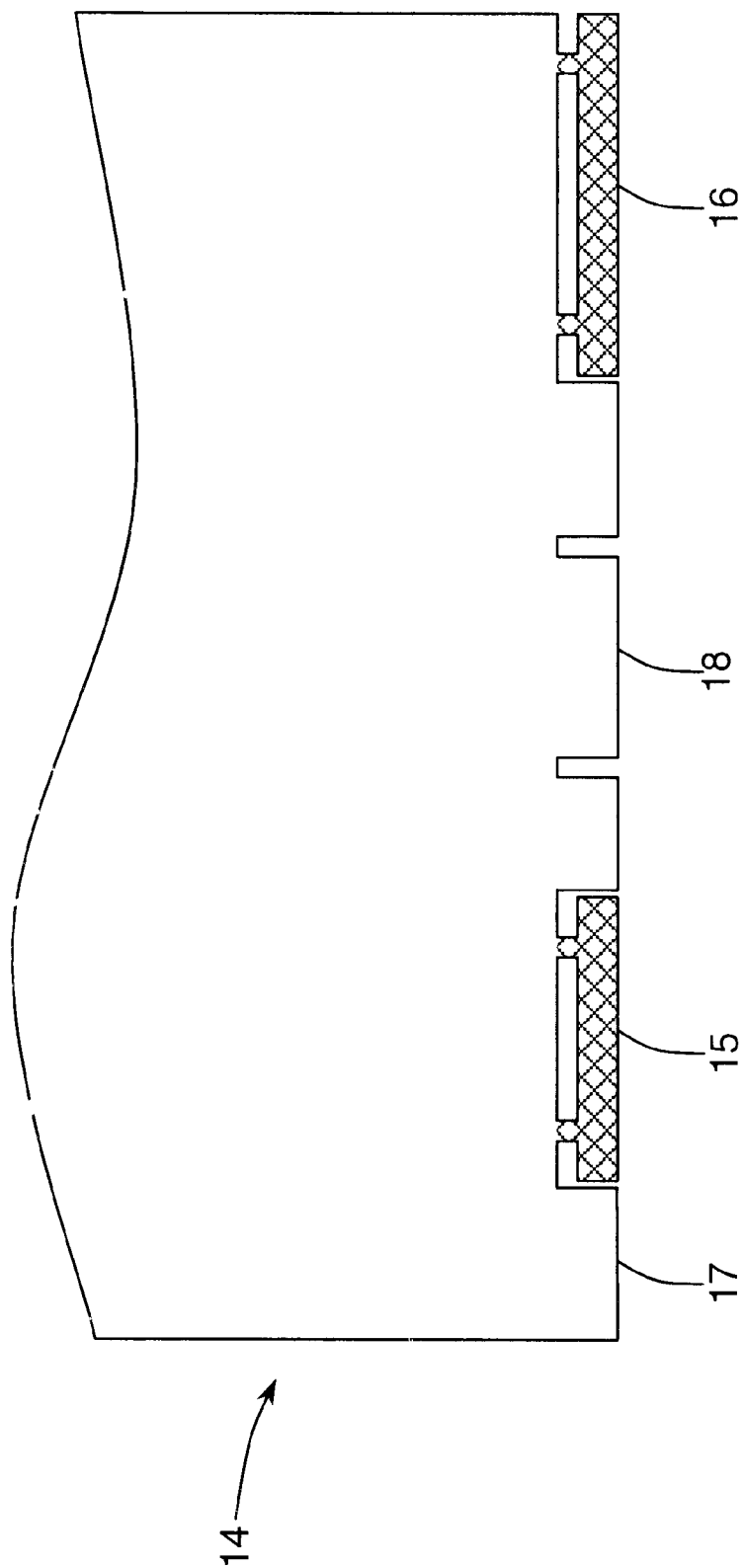
FIG. 4 shows a portion of a PCB work piece with scrap edges attached for a preferred embodiment of the present invention.

FIG. 4 shows a portion of a PCB work piece 14 for a preferred embodiment of the present invention. In a finishing operation, scrap edge pieces 15 and 16 will be removed by operation of the present invention, leaving PCB edge portions 17 and 18 intact. FIG. 5 shows the portion of PCB work piece 14 with scrap edge pieces 15 and 16 removed.

In operation, PCB work piece 14 is inserted in gap 9 such that the vertical edge adjacent PCB portion 17 abuts metal dowel 6, and the bottom edges of scrap edge pieces 15 and 16 rest on metal dowels 7 and 8. Positioned thus, PCB edge portions 17 and 18 are aligned with cut-outs 2 and 3, respectively, and scrap edge pieces 15 and 16 are aligned between scrap removal jaw portions 4 and 5, respectively.

As PCB work piece 14 is rocked back and forth, scrap edge pieces 15 and 16 engage scrap removal jaws 1 at scrap removal jaw portions 4 and 5. The rocking motion causes the frangible tabs connecting scrap edge pieces 15 and 16 to PCB work piece 14 to break, thus separating scrap edge pieces 15 and 16 from PCB work piece 14. Scrap edge pieces 15 and 16 fall through gap 9 between jaws 1, and through slot 10 in slotted plate 11. Slot 10 is dimensioned to allow scrap edge pieces 15 and 16 to freely fall through slot 10. Typically, slot 10 is a little wider than gap 9, and is a little longer than PCB work piece 14.

During the rocking motion of PCB work piece 14, PCB edge portions 17 and 18 move freely in cut-outs 2 and 3.

Metal dowels 6, 7 and 8 serve to position PCB work piece 14 in gap 9, and are positioned to allow scrap edge pieces 15 and 16 to fall through gap 9. Metal dowel 6 serves to position PCB work piece 14 in a horizontal direction. In the preferred embodiment, metal dowel 6 is flush with the outside edge of cut-away 2, such that the outside vertical edge of PCB work piece 14 adjacent PCB edge portion 17 will move freely in cut-out 2 during the rocking motion.

Metal dowels 7 and 8 are positioned to span gap 9 at scrap removal jaw portions 4 and 5, and support PCB work piece 14 at scrap edge pieces 15 and 16. The dowels are vertically positioned to allow PCB edge portions 17 and 18 to freely move in cut-outs 2 and 3 during the PCB work piece 14 rocking motion. The dowels are positioned horizontally such that when scrap edge pieces 15 and 16 separate from PCB work piece 14, the scrap edge pieces will fall through gap 9 rather than balance on the metal dowels. This is accomplished by positioning metal dowels 7 and 8 off-center with respect to scrap edge pieces 15 and 16.

As the scrap edge removal finishing operation is repeated for many PCB boards, scrap edge pieces accumulate on base plate 13 below slot 10, and are periodically removed.

While the present invention has been shown and described with respect to preferred embodiments, it will be understood by those skilled in the art that modifications may be made thereto without departing from the scope and spirit of the invention. For example, while a particular arrangement of scrap edge pieces 15, 16 and PCB edge portions 17, 18 are shown with correspondingly positioned cut-outs 2, 3, jaw portions 4, 5, and metal dowels 6, 7 and 8, different PCB board layouts may require different positions, dimensions and quantities of all these elements. Also, any known methods of connecting the invention pieces together (i.e., jaws to slotted plate, slotted plate to uprights, uprights to base plate) may be used provided they provide sufficient structural support to the tool to allow for unlimited finishing operations, and support enough to allow for the moving of the tool in the manufacturing environment. Also, while slotted plate 11, uprights 12 and base plate 13 form a particular tool stand, other tool stands may be used that will provide support for the tool, and allow the separated scrap edge pieces to fall through the gap so as not to interfere with the finishing operation on the next board, and will allow for at least a reasonable accumulation of scrap edge pieces below the jaws. For example, the jaws may be mounted directly to a set of uprights. Also, while the preferred embodiment shows scrap edge pieces 15 and 16 connected to PCB work piece 14 by frangible tabs, other methods of connection, e.g., scoring, perforating, etc., may be used singularly or together that will allow scrap edge pieces 15 and 16 to be removed by the rocking motion of the finishing operation described above. It is intended that the scope of the invention be defined by the claims appended hereto and their equivalents.

What is claimed is:

1. A printed circuit board (PCB) scrap edge removal tool for use on a PCB work piece having along a work edge a vertical alignment edge and a bottom edge and an arrangement of scrap edge pieces and PCB edge portions, the scrap edge pieces to be removed while the PCB edge portions remain intact, the tool comprising:

a pair of matching opposing jaws;

said jaws in a spaced apart relationship such that a uniform gap is formed between them, said gap sufficiently wide to allow the work edge of the PCB work piece to be freely inserted and removed;

said jaws having a matching opposing arrangement of crenatures and crenations corresponding to the PCB edge portions and scrap edge pieces, respectively;

a horizontal positioning dowel spanning said gap and positioned such that when the work edge is inserted in said gap with the vertical alignment edge abutted against said horizontal positioning dowel, the PCB edge portions and scrap edge pieces are aligned between said crenatures and crenations, respectively; and vertical positioning dowels spanning said gap at said crenations, said vertical positioning dowels positioned such that when the work edge is inserted in said gap with the vertical alignment edge abutted against said horizontal positioning dowel, and the bottom edge is against said vertical positioning dowels, that when said PCB work piece is rocked back and forth, said PCB edge portions move freely in said crenatures, and said scrap edge pieces engage said crenations causing the scrap edge pieces to separate from the PCB work piece.

2. A printed circuit board (PCB) scrap edge removal tool according to claim 1, wherein said opposing jaws are mounted on a tool stand that allows the scrap edge pieces that separate from the PCB work piece to freely fall through said gap, and will allow for at least a reasonable accumulation of scrap edge pieces below said jaws.

3. A printed circuit board (PCB) scrap edge removal tool according to claim 1, wherein said vertical positioning dowels are positioned off center with respect to the scrap edge pieces, such that when the scrap edge pieces separate from the PCB work piece, the scrap edge pieces fall through said gap rather than balance on said vertical positioning dowels.

* * * * *